(12) United States Patent
Cho et al.

(10) Patent No.: US 10,461,725 B2
(45) Date of Patent: Oct. 29, 2019

(54) VOLTAGE COMPARATOR, VOLTAGE COMPARISON METHOD OF THE SAME, AND RESET METHOD OF THE SAME

(71) Applicant: ELECTRONICS AND TELECOMMUNICATIONS RESEARCH INSTITUTE, Daejeon (KR)

(72) Inventors: Young Kyun Cho, Daejeon (KR); Cheol Ho Kim, Daejeon (KR); Bong Hyuk Park, Daejeon (KR); Kwangchun Lee, Daejeon (KR); Jae Ho Jung, Daejeon (KR); Seok Bong Hyun, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 174 days.

(21) Appl. No.: 15/622,513

(22) Filed: Jun. 14, 2017

(65) Prior Publication Data
US 2018/0083608 A1    Mar. 22, 2018

(30) Foreign Application Priority Data
Sep. 21, 2016  (KR) .......................... 10-2016-0120964

(51) Int. Cl.
*H03K 5/24* (2006.01)
*H03K 5/00* (2006.01)

(52) U.S. Cl.
CPC ........... *H03K 5/2481* (2013.01); *H03K 5/249* (2013.01); *H03K 2005/00013* (2013.01)

(58) Field of Classification Search
CPC ........ H03K 5/24; H03K 5/2481; H03K 5/249; H03K 2005/00013
See application file for complete search history.

(56) References Cited

U.S. PATENT DOCUMENTS 5,631,650 A     5/1997  Hsu
6,288,666 B1 *  9/2001  Afghahi ............... H03K 5/2481
                                                      327/52

(Continued)

OTHER PUBLICATIONS

Lauri Sumanen et al., "CMOS Dynamic Comparators for Pipeline A/D Converters", IEEE, pp. V-157-V-160, 2002.

(Continued)

*Primary Examiner* — Lincoln D Donovan
*Assistant Examiner* — Diana J. Cheng
(74) *Attorney, Agent, or Firm* — Rabin & Berdo, P.C.

(57) ABSTRACT

A voltage comparator comparing a voltage of a first input signal and a voltage of a second input signal is provided. The voltage comparator includes: a first switch pair transmitting, respectively, the first input signal and the second input signal to a control terminal of a first transistor and a control terminal of a second transistor in response to a clock signal; a second switch pair connecting a first terminal and a second terminal of the first transistor and connecting a first terminal and a second terminal of the second transistor in response to at least one of the clock signal and a reset signal; and a first reset switch connecting the control terminal of the first transistor and the control terminal of the second transistor in response to the reset signal.

20 Claims, 13 Drawing Sheets

(56) References Cited

U.S. PATENT DOCUMENTS

| | | | |
|---|---|---|---|
| 7,215,159 B2 | 5/2007 | Shimizu et al. | |
| 7,479,915 B1 | 1/2009 | Singh et al. | |
| 7,605,615 B2 | 10/2009 | Yukawa | |
| 8,111,090 B2 | 2/2012 | Gebara et al. | |
| 2004/0178839 A1* | 9/2004 | Kinugasa | H03K 5/2481 327/307 |
| 2008/0143577 A1* | 6/2008 | Tomisawa | H03K 3/35613 341/165 |
| 2014/0085122 A1 | 3/2014 | Jeon et al. | |
| 2015/0102952 A1* | 4/2015 | Yang | H03K 5/2481 341/161 |
| 2016/0142028 A1 | 5/2016 | Kim et al. | |

OTHER PUBLICATIONS

R. Lotfi et al., "A 1-V MOSFET-Only Fully-Differential Dynamic Comparator for Use in Low-Voltage Pipelined A/D Converters", IEEE, pp. 377-380, 2003.

Lauri Sumanen et al., "A Mismatch Insensitive CMOS Dynamic Comparator for Pipeline A/D Converters", IEEE, pp. 32-35, 2000.

Young-Kyun Cho et al., "A 10-bit 30-MS/s successive approximation register analog-to-digital converter for low-power sub-sampling applications", Microelectronics Journal, vol. 42, pp. 1335-1342, 2011.

Junfeng Gao et al., "An Amplifier-Free Pipeline-SAR ADC Architecture with Enhanced Speed and Energy Efficiency", IEEE Transactions on Circuits and Systems II: Express Briefs, pp. 1-5, 2015.

\* cited by examiner (a)

(b)

(a) Sampling (b) Hold (c) latch (d) Reset

VOLTAGE COMPARATOR, VOLTAGE COMPARISON METHOD OF THE SAME, AND RESET METHOD OF THE SAME

CROSS-REFERENCE TO RELATED APPLICATION

This application claims priority to and the benefit of Korean Patent Application No. 10-2016-0120964 filed in the Korean Intellectual Property Office on Sep. 21, 2016, the entire contents of which are incorporated herein by reference.

BACKGROUND OF THE INVENTION

(a) Field of the Invention

The present invention relates to voltage comparator, a voltage comparator method of the same, and a voltage comparator reset method of the same.

(b) Description of the Related Art

A voltage comparator is a very important block (circuit) essentially used in most analog circuits and an RF (radio frequency) circuit such as a data converter, a signal generator, a power converter, etc. The voltage comparator performs a function such as a magnitude comparison between input signals and a magnitude comparison between an input signal and a reference signal.

To increase accuracy, the conventional voltage comparator uses a structure in which a sample-and-hold (S/H) circuit, a preamplifier, and a latch circuit are connected in a cascade structure.

To correctly compare the magnitude of the input signal that is dynamically changed according to time, most of the voltage comparators performs a pre-amplification and latch operation after converting a dynamic signal into a static signal through sampling of the input signal. That is, as the voltage comparator converts the signal that is changed according to time into a signal that is independent with respect to time, high speed and accuracy of the voltage comparator may be obtained.

However, to prevent a malfunction of the S/H circuit and the latch circuit of the conventional voltage comparator, a non-overlapped two-phase clock must be used. Also, the conventional voltage comparator is additionally required to have a capacitor of a passive element and a common mode voltage for the sampling of the input signal. Because these requirements increase power consumption of the voltage comparator circuit as well as a chip area, it is difficult to apply the conventional voltage comparator to an application requiring low power consumption and a small size.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a voltage comparator without a requirement of a passive capacitor and a common mode voltage, a voltage comparison method thereof, and a reset method thereof.

Further, the present invention provides a voltage comparator in which an S/H circuit and a latch circuit are integrated, a voltage comparison method thereof, and a reset method thereof.

A voltage comparator comparing a voltage of a first input signal and a voltage of a second input signal is provided. The voltage comparator includes: a first switch pair transmitting, respectively, the first input signal and the second input signal to a control terminal of a first transistor and a control terminal of a second transistor in response to a clock signal; a second switch pair connecting a first terminal and a second terminal of the first transistor and connecting a first terminal and a second terminal of the second transistor in response to at least one of the clock signal and a reset signal; and a first reset switch connecting the control terminal of the first transistor and the control terminal of the second transistor in response to the reset signal.

When the first switch pair and the second switch pair are turned on in a first period in which the clock signal is a first level, the first input signal and the second input signal may be respectively charged to a first parasitic capacitor of the first transistor and a second parasitic capacitor of the second transistor.

The first parasitic capacitor may include a first gate capacitor (or a first gate capacitance) expressed by a sum of a capacitance due to a gate oxide of the first transistor and a capacitance due to a depletion region of the first transistor.

When the first switch pair and the second switch pair are turned off in a second period in which the clock signal is a second level, a first charge amount stored in the first parasitic capacitor and a second charge amount stored in the second parasitic capacitor may be maintained.

The second period may include a first sub-period in which the first charge amount and the second charge amount are maintained and a second sub-period in which a latch signal is the first level.

When a third transistor is activated in the second sub-period after the first sub-period, a first signal representing a comparison result between the first charge amount and the second charge amount may be output.

One terminal of the third transistor may be connected to a first node, and the other terminal of the third transistor may be connected to a ground voltage.

The first node may be connected to the first transistor, the second transistor, and the second switch pair.

A starting point of the second sub-period may be controlled through a time delay for the clock signal, and an end point of the second sub-period may be determined based on an asynchronous clock signal.

The second period may further include a third sub-period in which the reset signal is the first level.

When the first reset switch is turned on in the third sub-period after the second sub-period, the charge of the first parasitic capacitor and the charge of the second parasitic capacitor may be reset.

The charge of the first parasitic capacitor and the charge of the second parasitic capacitor may be reset through averaging of the charge of the first parasitic capacitor and the charge of the second parasitic capacitor.

A starting point of the third sub-period may be the same as the end point of the second sub-period.

The end point of the third sub-period may be the same as an end point of the second period.

The voltage comparator may further include: a second reset switch connecting the control terminal of the first transistor and the first terminal of the first transistor in response to the reset signal; and a third reset switch connecting the control terminal of the second transistor and the first terminal of the second transistor in response to the reset signal.

The voltage comparator may further include a second reset switch connecting the first terminal of the first transistor and the first terminal of the second transistor and connecting the second terminal of the first transistor and the second terminal of the second transistor in response to the reset signal.

Also, according to another exemplary embodiment of the present invention, a comparison method for comparing a voltage of a first input signal and a voltage of a second input signal by a voltage comparator including a first transistor, a second transistor, and a third transistor is provided. The comparison method of the voltage comparator includes: respectively charging the first input signal and the second input signal to a first parasitic capacitor of the first transistor and a second parasitic capacitor of the second transistor by turning on a first switch pair and a second switch pair included in the voltage comparator in a first period in which a clock signal is a first level; holding a first charge amount of the first parasitic capacitor and a second charge amount of the second parasitic capacitor during a first sub-period among a second period by turning off the first switch pair and the second switch pair in the second period in which the clock signal is a second level; and comparing the first charge amount and the second charge amount by activating the third transistor in a second sub-period after the first sub-period in the second period.

The comparison method of the voltage comparator may further include resetting the first parasitic capacitor and the second parasitic capacitor by turning on a first reset switch included in the voltage comparator in a third sub-period after the second sub-period in the second period.

A starting point of the second sub-period may be controlled through a time delay for the clock signal, and an end point of the second sub-period may be determined through an asynchronous clock signal.

A starting point of the third sub-period may be the same as an end point of the second sub-period, and an end point of the third sub-period may be the same as an end point of the second period.

The charging may include: respectively transmitting the first input signal and the second input signal to a gate of the first transistor and a gate of the second transistor through the first switch pair; and connecting a drain and a source of the first transistor and connecting a drain and a source of the second transistor through the second switch pair.

The resetting may include: connecting a gate of the first transistor and a gate of the second transistor through the first reset switch; connecting the gate of the first transistor and a drain of the first transistor by turning on a second reset switch included in the voltage comparator; and connecting the gate of the second transistor and a drain of the second transistor by turning on a third reset switch included in the voltage comparator.

According to another exemplary embodiment of the present invention, a reset method of a voltage comparator including a first transistor and a second transistor is provided. The reset method of the voltage comparator includes: turning on a first reset switch connecting a gate of the first transistor and a gate of the second transistor in a reset period; turning on a second reset switch connecting the gate of the first transistor and a drain of the first transistor in the reset period; and turning on a third reset switch connecting the gate of the second transistor and a drain of the second transistor in the reset period.

A first period in which a clock signal for an operation of the voltage comparator has a first level may include a sampling period in which a first input signal and a second input signal are respectively charged to a first parasitic capacitor of the first transistor and a second parasitic capacitor of the second transistor.

A second period in which the clock signal has a second level may include a latch period in which a charge amount of the first parasitic capacitor and a charge amount of the second parasitic capacitor are compared, and the reset period after the latch period.

DETAILED DESCRIPTION OF THE EMBODIMENTS

Figure 1:
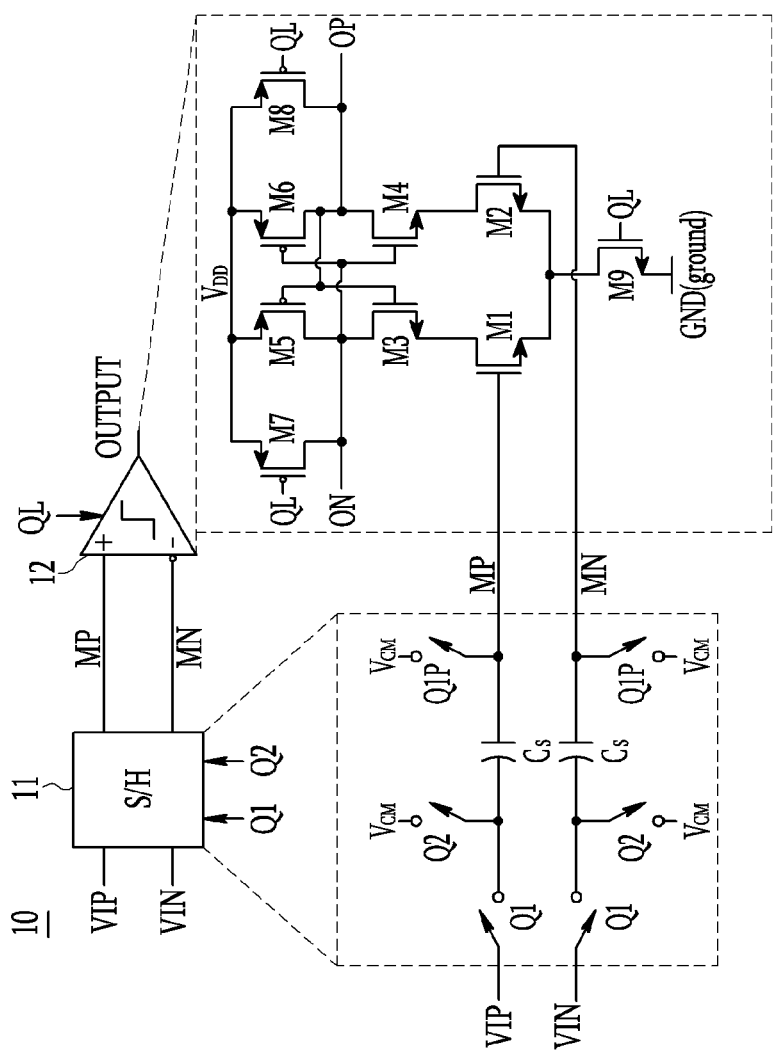
FIG. 1 is a view showing a voltage comparator.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In this specification, redundant description of the same constituent elements is omitted.

Also, in this specification, it is to be understood that when one component is referred to as being "connected" or "coupled" to another component, it may be connected or coupled directly to another component or may be connected or coupled to the other component with another component intervening therebetween. On the other hand, in this specification, it is to be understood that when one component is referred to as being "connected or coupled directly" to another component, it may be connected or coupled to the other component without another component intervening therebetween.

It is also to be understood that the terminology used herein is only for the purpose of describing particular embodiments and is not intended to be limiting of the invention.

Singular forms are to include plural forms unless the context clearly indicates otherwise.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof.

Also, as used herein, the term "and/or" includes any combination of items or any of a plurality of listed items. In this specification, "A or B" may include "A", "B", or "A and B".

Figure 2:
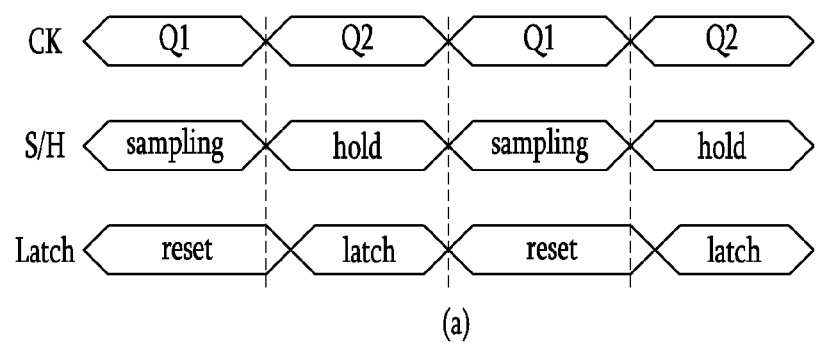
FIG. 2 is a view showing an operation of the voltage comparator of FIG. 1.
Figure 2:
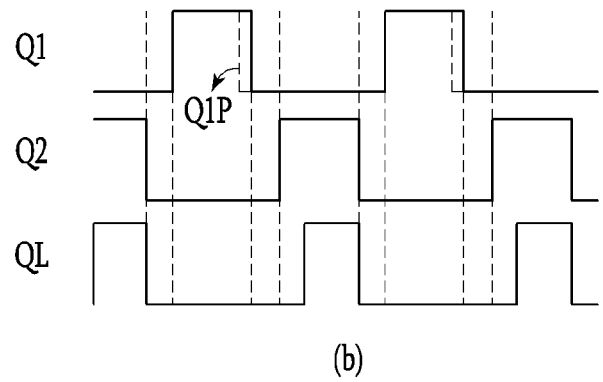

FIG. 1 is a view showing a voltage comparator. FIG. 2 is a view showing an operation of the voltage comparator of FIG. 1. In detail, in FIG. 2, (a) represents an operation according to time of an S/H circuit and a latch circuit, and (b) represents a timing diagram of the voltage comparator.

The voltage comparator 10 of FIG. 1 is configured of an S/H circuit 11 and a latch circuit 12.

The S/H circuit 11 includes a plurality of switches that are turned on/off in response to clock signals Q1, Q2, and Q1P, and a capacitor $C_s$ for sampling. The S/H circuit 11 outputs two input signals VIP and VIN to the latch circuit 12 after sampling two signals MP and MN.

The latch circuit 12 includes a plurality of transistors M1-M9. The latch circuit 12 outputs comparison results ON and OP after comparing a voltage difference between two signals MP and MN input from the S/H circuit 11.

In detail, each of the S/H circuit 11 and the latch circuit 12 performs the operation as in (a) of FIG. 2 according to time. For this, clock signals Q1, Q1P, Q2, and QL as in (b) of FIG. 2 are required. A duty cycle of the clock signal Q1P based on the clock signal Q1 is smaller than the duty cycle of the clock signal Q1. The voltage comparator 10 samples the voltage of each of the input signals VIP and VIN input to the capacitors Cs to compare the two input signals VIP and VIN, and distinguishes a magnitude difference between the two input signals VIP and VIN through the latch circuit 12. For example, the S/H circuit 11 performs a sampling operation and a hold operation according to the clock signals Q1, Q1P, and Q2, and the latch circuit 12 performs a reset operation and a latch operation according to a clock signal QL. An on time of the clock signal Q1 and an on time of the clock signal Q2 are not overlapped with each other.

There are essential requirements for the operation of the voltage comparator 10. First, to prevent a malfunction of the S/H circuit 11 and the latch circuit 12, two non-overlapped phase clock signals Q1 and Q2 must be used. Second, the capacitor $C_s$ of the passive element and a common mode voltage $V_{CM}$ are additionally required for the sampling of the input signals VIP and VIN. These requirements increase the power consumption of the voltage comparator 10 and the chip area such that it is difficult to use the voltage comparator 10 for an application requiring low power consumption and a small size.

Hereinafter, a voltage comparator without the S/H circuit and the complex clock technique (or a clock circuit) will be described.

Figure 3:
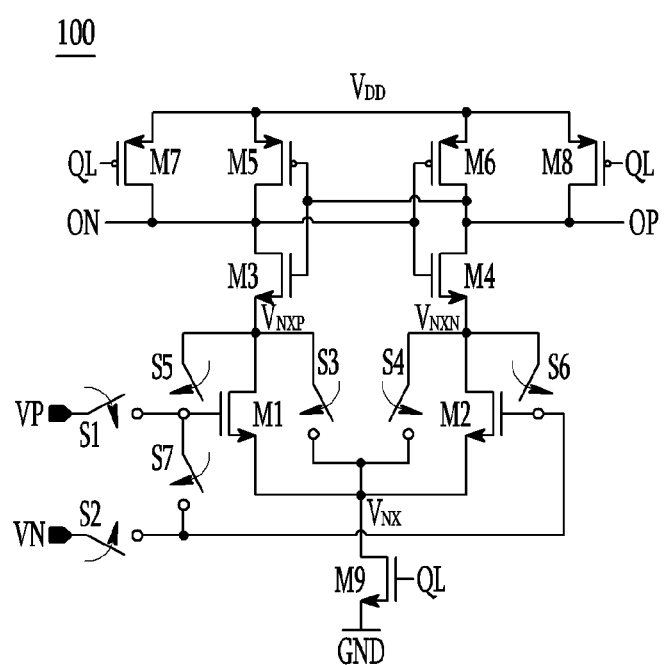
FIG. 3 is a view showing a voltage comparator according to an exemplary embodiment of the present invention.

FIG. 3 is a view showing a voltage comparator according to an exemplary embodiment of the present invention.

The voltage comparator 100 includes the latch circuit 12 of FIG. 1 and a plurality of switches S1-S7. That is, the plurality of switches S1-S7 are added to the latch circuit 12 of FIG. 1, so the voltage comparator 100 may be realized by a single block (a single circuit). The voltage comparator 100 implemented by the single block (the single circuit) may simultaneously perform the S/H function and the latch function.

Because the voltage comparator 100 does not use the passive element (for example, $C_s$) and the common mode voltage $V_{CM}$ used by the voltage comparator 10 of FIG. 1, the power consumption and the area of the voltage comparator 100 may be reduced.

Figure 4:
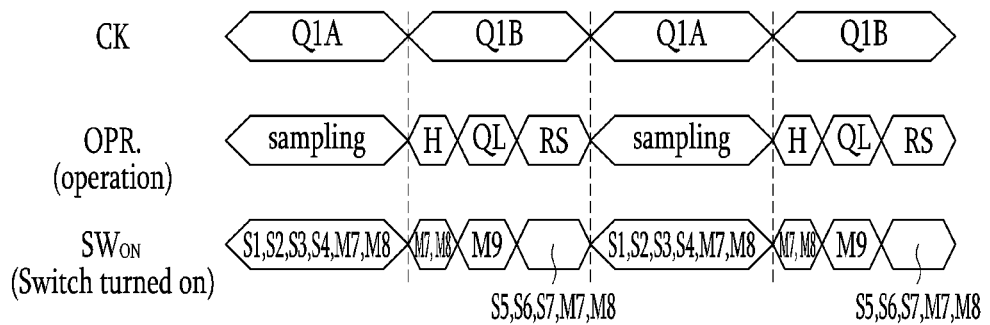
FIG. 4 is a view showing an operation of the voltage comparator of FIG. 3 according to an exemplary embodiment of the present invention.

FIG. 4 is a view showing an operation of the voltage comparator of FIG. 3 according to an exemplary embodiment of the present invention.

Differently from the comparator 10 of FIG. 1, the voltage comparator 100 requires the non-overlapped two phase clock signal (for example, Q1, Q2). That is, because the voltage comparator 100 is operated through one clock signal Q1, effects of the area reduction and the power consumption reduction may be obtained. The clock signal Q1 includes a positive half-period signal and a negative half-period signal. Hereinafter, the positive half-period signal of the clock signal Q1 is referred to as Q1A, and the negative half-period signal of the clock signal Q1 is referred to as Q1B.

The operation of the voltage comparator 100 will be described with reference to FIG. 4.

First, in the period (a high level period of the clock signal Q1) of the positive half-period signal Q1A, the switches S1, S2, S3, and S4 and the transistors M7 and M8 are turned on. If the switches S1-S4 and the transistors M7 and M8 are turned on, the voltage comparator 100 performs the sampling operation. Here, the transistors M7 and M8 are transistors operated as a switch.

Next, in the period (a low level period of the clock signal Q1) of the negative half-period signal Q1B, the voltage comparator 100 sequentially performs the hold operation, the latch operation and the reset operation. In FIG. 4, H represents the hold operation, QL represents the latch operation (or the operation signal for the latch circuit), and RS represents the reset operation (or the clock signal for the reset).

In detail, if the switches S1-S4 are turned off in the period of the negative half-period signal Q1B, the hold operation for the sampled signal is automatically performed. In the hold operation, the transistors M7 and M8 are in a turned-on state. Next, if the operation signal QL of the latch circuit is applied, the operation (the latch operation) distinguishing (comparing) the magnitude of the sampled signals is performed. In the latch operation, the transistor M9 is turned on. Here, the transistor M9 is the transistor operated as the switch. If the latch operation is completed, the switches S5, S6, and S7 and the transistors M7 and M8 are simultaneously turned on. If the switches S5-S7 and the transistors M7 and M8 are turned on, the reset operation of the voltage comparator 100 is performed.

The voltage comparator 100 may perform the S/H function and the latch (+ reset) function that are respectively performed by two blocks (the S/H circuit 11 and the latch circuit 12) of the voltage comparator 10 of FIG. 1, through one block (the circuit). Accordingly, the voltage comparator 100 may be simply and clearly realized. The reason that the voltage comparator 100 can perform the above-described operation through one block (circuit) will be described with reference to FIG. 5A and FIG. 5B.

Figure 5A:
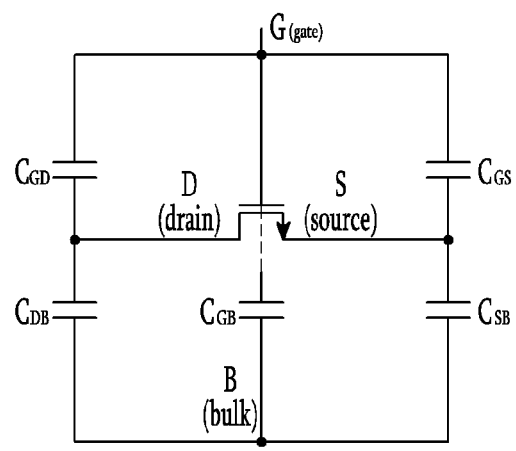
FIG. 5A is a view showing a parasitic capacitor of an input transistor according to an exemplary embodiment of the present invention.
Figure 5B:
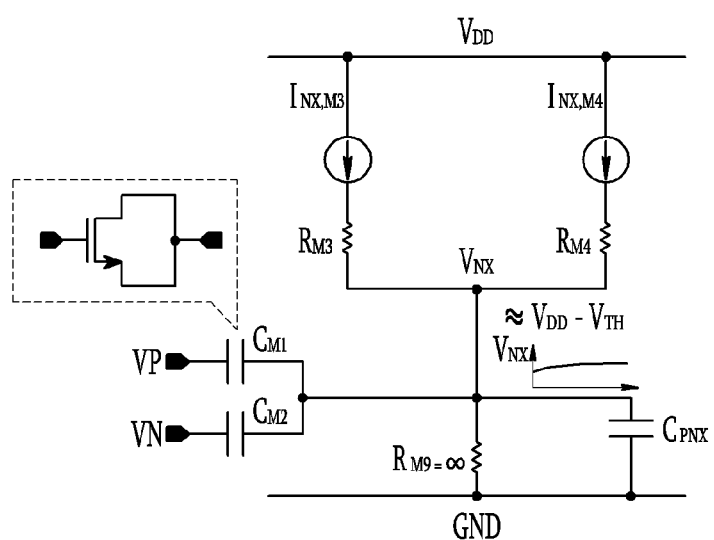
FIG. 5B is a view showing a case that the voltage comparator of FIG. 3 performs a sampling operation.

FIG. 5A is a view showing a parasitic capacitor of an input transistor according to an exemplary embodiment of the present invention. FIG. 5B is a view showing a case that the voltage comparator of FIG. 3 performs a sampling operation. In FIG. 5B, each of the capacitors $C_{M1}$ and $C_{M2}$ corresponds to gate capacitors $C_{GD}$, $C_{GS}$, and $C_{GB}$ of each of the transistors M1 and M2, a resistor $R_{M9}$ corresponds to the transistor M9, and sink currents $I_{NX,M3}$ and $I_{NX,M4}$ and resistors $R_{M3}$ and $R_{M4}$ correspond to the transistors M3 and M4.

Each of the input transistors M1 and M2 of the latch circuit included in the voltage comparator 100 may be modeled as illustrated in FIG. 5A.

A parasitic capacitor component included in the input transistors M1 and M2 may include junction capacitors $C_{DB}$ and $C_{SB}$ generated by a junction area and a sidewall of the input transistors M1 and M2, overlap capacitors $C_{GD}$ and $C_{GS}$ generated by an overlap between a gate region and a drain region of the input transistors M1 and M2 and an overlap between the gate region and the source region of the input transistors M1 and M2, and a gate-bulk capacitor $C_{GB}$ formed of a sum of a capacitance due to a gate oxide of the input transistors M1 and M2 and a capacitance due to a depletion region of the input transistors M1 and M2.

The operation of the voltage comparator 100 will be described again along with the parasitic capacitor components $C_{DB}$, $C_{SB}$, $C_{GD}$, $C_{GS}$, and $C_{GB}$.

First, in the sampling operation of the voltage comparator 100, the switches S1-S4 and the transistors M7 and M8 are turned on, and the source and the drain of the input transistors M1 and M2 are connected by a short connection. Accordingly, the voltage of the node $V_{NXP}$, the voltage of the node $V_{NXN}$, and the voltage of the node $V_{NX}$ become the same. In this case, the transistors M3 and M4 connected to the node $V_{NX}$ represent a diode-connection by the drain and the gate thereof that are grouped into a power voltage $V_{DD}$, and the transistor M9 is inactivated (or turned off). Accordingly, a current (a sub-threshold current) that is a threshold voltage or less flows to the transistors M3 and M4. This current charges the parasitic capacitor $C_{PNX}$ of the node $V_{NX}$ until the voltages $V_{GS3}$ and $V_{GS4}$ between the gate and the source of the transistors M3 and M4 reaches the threshold voltages $V_{TH3}$ and $V_{TH4}$ of the transistors M3 and M4.

When the voltage of the node $V_{NX}$ becomes the ($V_{DD}$-$V_{TH}$) level (for example, ($V_{DD}$-$V_{TH3}$) or ($V_{DD}$-$V_{TH4}$)), the transistors M3 and M4 are turned off and the voltage of the node $V_{NX}$ is fixed to this level. Because the transistors M3 and M4 are operated in the current that is the threshold voltage or less, the charge time and the efficiency of the parasitic capacitor $C_{PNX}$ of the node $V_{NX}$ may be improved by reducing an off-state leakage current of the transistor M9.

Because the source and the drain of the input transistors M1 and M2 are short-circuited, the junction capacitors $C_{DB}$ and $C_{SB}$ do not affect the sampling of the input signals VP and VN, and the overlap capacitors $C_{GD}$ and $C_{GS}$ and the gate bulk capacitor $C_{GB}$ are only engaged to the sampling operation.

Because the source, the drain, and a body of the input transistors M1 and M2 have a predetermined potential value, the input signals VP and VN are sampled (charged) through the capacitors $C_{GD}$, $C_{GS}$, and $C_{GB}$ of the input transistors M1 and M2.

That is, by the physical operation principle, the voltage comparator 100 may remove the passive capacitor $C_s$ and the common mode voltage $V_{CM}$ that are used by the voltage comparator 10 of FIG. 1. That is, the gate capacitor components $C_{GD}$, $C_{GS}$, and $C_{GB}$ of the transistors M1 and M2 may be replaced with the passive capacitor $C_s$, and the voltage of the node $V_{NX}$ fixed to the ($V_{DD}$-$V_{TH}$) level may be replaced with the common mode voltage $V_{CM}$.

On the other hand, if the switches S1-S4 are turned off in the hold operation of the voltage comparator 100, the charge (or the charge amount) stored in the gate capacitors $C_{GD}$, $C_{GS}$, and $C_{GB}$ is held (maintained) as it is. To increase the sampling accuracy of the voltage comparator 100, the voltage comparator 100 may sequentially turn off the switches S3 and S4 and the switches S1 and S2 by using the time delay of the clock signal Q1. That is, after the switches S3 and S4 are turned off, the switches S1 and S2 may be turned off.

After the hold operation, the voltage comparator 100 compares the amount of the charge sampled (charged) in the gate capacitors $C_{GD}$, $C_{GS}$, $C_{GB}$) of two input transistors M1 and M2 in the latch operation of the voltage comparator 100 to determine an amount of a difference and performs the operation of outputting a digital signal representing the difference. In the reset operation of the voltage comparator 100, the voltage comparator 100 averages the charges stored in the gate capacitors $C_{GD}$, $C_{GS}$, and $C_{GB}$ of two input transistors M1 and M2, thereby performing the operation of making an initial state through the switch S7. Also, because the switches S5 and S6 are installed to minimize the influence of the overlap capacitor $C_{GD}$, the installation thereof may be omitted if necessary.

Figure 6:
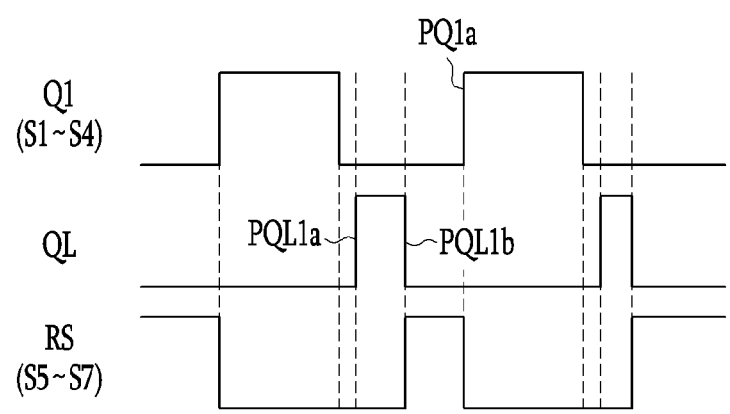
FIG. 6 is a view showing a timing diagram of a voltage comparator according to an exemplary embodiment of the present invention.

FIG. 6 is a view showing a timing diagram of a voltage comparator according to an exemplary embodiment of the present invention.

The clock signal Q1 is generated based on the clock signal applied from the outside. The clock signal Q1 is used to control the switches S1-S4.

A starting point PQL1$a$ of the clock signal QL for the latch circuit of the voltage comparator 100 may be controlled through the time delay of the negative half-period signal Q1B, and an end point PQL1$b$ of the clock signal QL may be determined through an asynchronous clock.

The clock signal RS for the reset operation starts at the end point PQL1$b$ of the clock signal QL and is ended at the starting point PQ1$a$ of the clock signal Q1. The clock signal RS is used to control the switches S5-S7. For example, if the switch S5 is turned on, the gate and the drain of the transistor M1 are connected, while if the switch S6 is turned on, the gate and the drain of the transistor M2 are connected.

The detailed operation of the voltage comparator 100 based on the clock signals Q1, QL, and RS will be described again with reference to FIG. 7A and FIG. 7B.

Figure 7A:
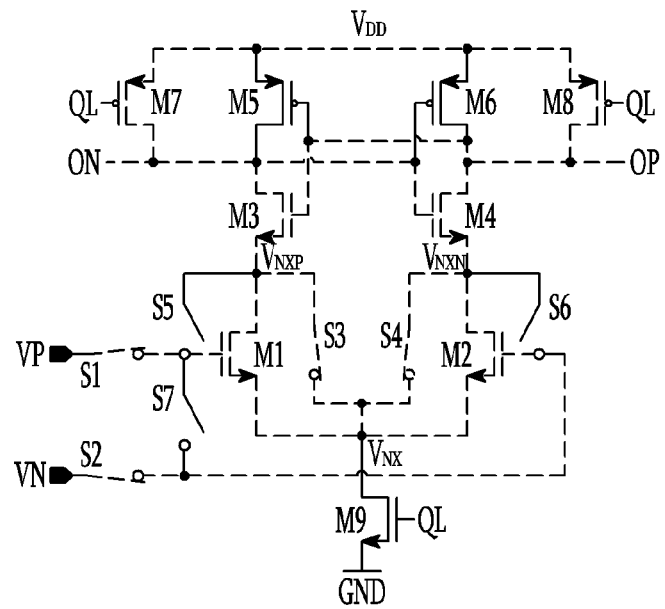
FIG. 7A and FIG. 7B are views showing a sampling operation, a hold operation, a latch operation, and a reset operation, performed by a voltage comparator according to a clock, according to an exemplary embodiment of the present invention.
Figure 7A:
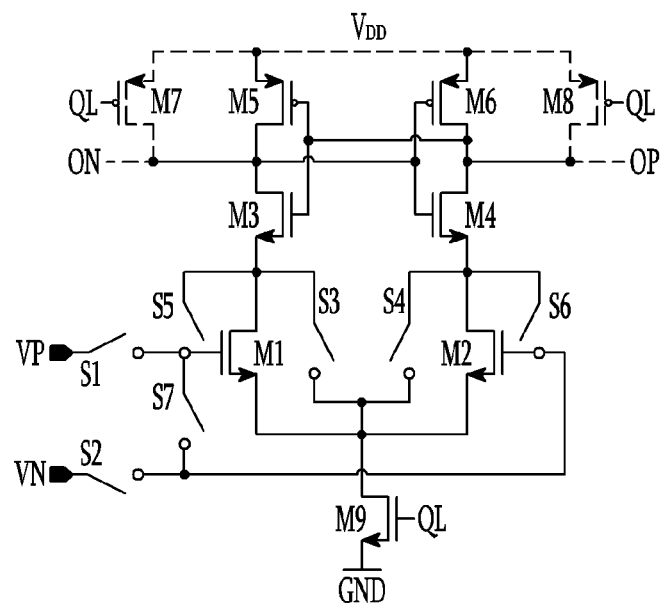
Figure 7B:
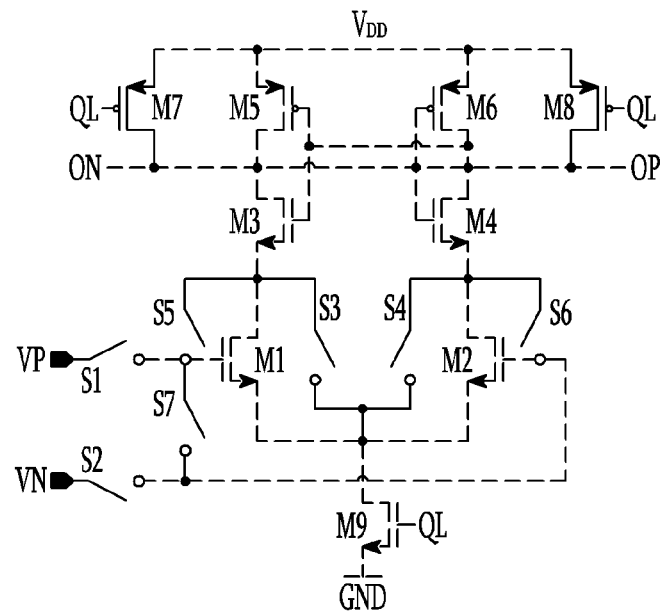
Figure 7B:
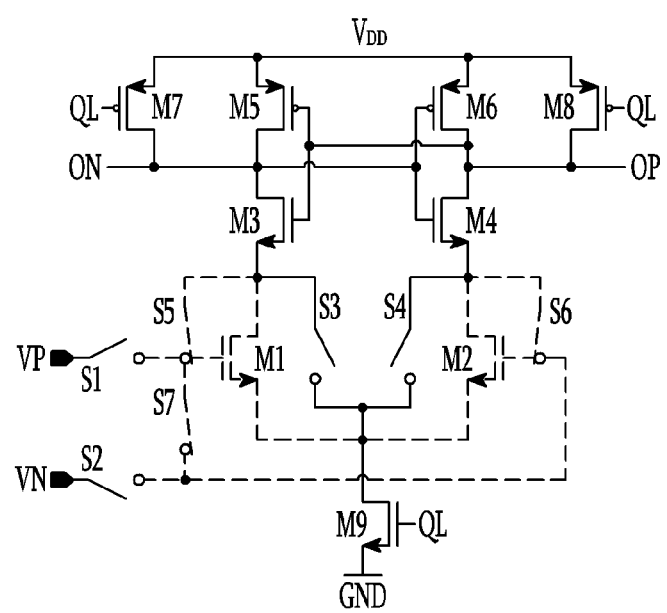

FIG. 7A and FIG. 7B are views showing a sampling operation, a hold operation, a latch operation, and a reset operation, performed by a voltage comparator according to a clock, according to an exemplary embodiment of the present invention.

FIG. 7A and FIG. 7B show constituent elements for each operation (the sampling operation, the hold operation, the latch operation, and the reset operation) among the constituent elements of the voltage comparator 100 by a dotted line.

First, as illustrated in ($a$) of FIG. 7A, if the switches S1-S4 are turned on in the sampling operation of the voltage comparator 100 and the transistors M1, M2, M3, M4, M7, and M8 are activated, the sampling operation for the input signals VP and VN is performed. For example, if the switches S3 and S4 are turned on, the source and the drain of the transistors M1 and M2 are connected. Also, as the transistors M3 and M4 are operated with the current of the threshold voltage or less, if the voltage of the node $V_{NX}$ is fixed to the predetermined voltage, the input signals VP and VN are transmitted to the gate of the transistors M1 and M2 by the switches S1 and S2. In this case, the outputs ON and OP of the voltage comparator 100 are fixed into the power voltage $V_{DD}$ level.

Also, as illustrated in (b) of FIG. 7A, because the switches S1-S4 that are turned on in the sampling operation are all turned off in the hold operation of the voltage comparator 100, the input signal (the sampled signal) is held by the gate capacitors $C_{GD}$, $C_{GS}$, and $C_{GB}$ of the input transistors M1 and M2.

Also, as illustrated in (c) of FIG. 7B, the transistors M1-M6 and M9 are activated in the latch operation of the voltage comparator 100, and the difference between the input signals VP and VN is output. In detailed, the signal representing the comparison result between the charges sampled in the gate capacitors $C_{GD}$, $C_{GS}$, and $C_{GB}$ of the input transistor M1 and the charges sampled in the gate capacitors $C_{GD}$, $C_{GS}$, and $C_{GB}$ of the input transistor M2 is output. One of the output signal OP and the output signal ON has a power voltage $V_{DD}$ level, and the other has a ground voltage GND level.

Also, as illustrated in (d) of FIG. 7B, if the switches S5-S7 are turned on (connected), in the reset operation of the voltage comparator 100, the charges existing in the gate-bulk capacitor $C_{GB}$ and the overlap capacitors $C_{GD}$ and $C_{GS}$ are reset. For example, if the switch S7 is turned on, the gate of the transistor M1 and the gate of the transistor M2 are connected.

On the other hand, various reset methods for the reset operation of the voltage comparator 100 may be used. That is, the reset operation may be performed through various switch configurations as well as the method of resetting by using the method (the switches S5-S7) as illustrated in (d) of FIG. 7B. The various reset methods will be described with reference to FIG. 8A, FIG. 8B, and FIG. 8C.

Figure 8A:
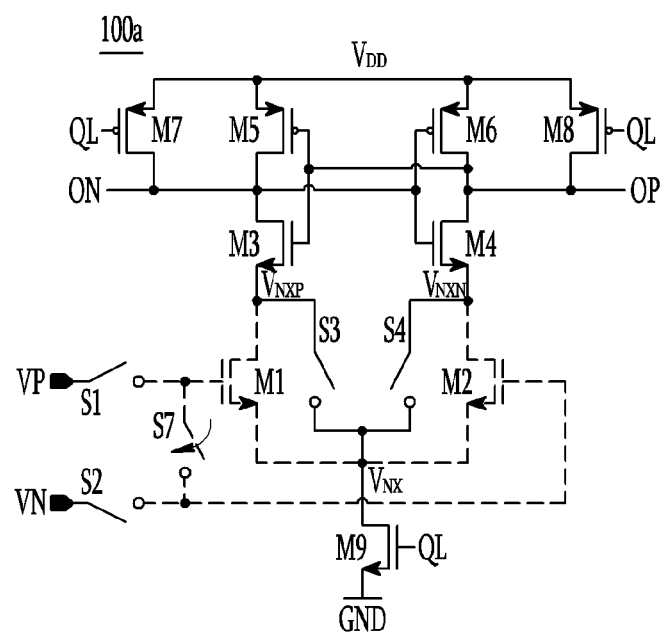
FIG. 8A, FIG. 8B, and FIG. 8C are views showing a voltage comparator according to another exemplary embodiment of the present invention.
Figure 8B:
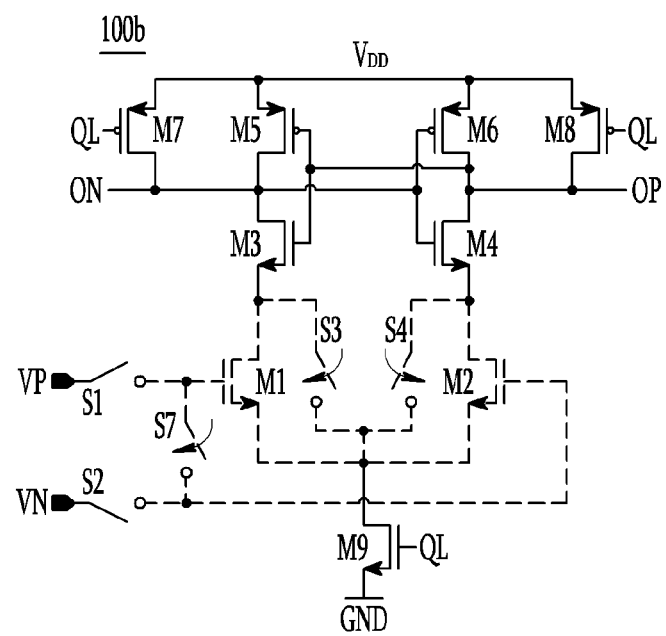
Figure 8C:
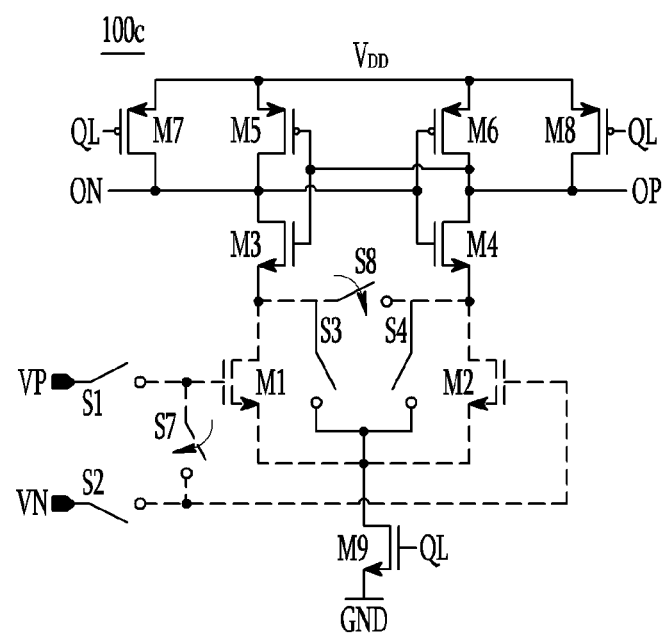

FIG. 8A, FIG. 8B, and FIG. 8C are views showing a voltage comparator according to another exemplary embodiment of the present invention.

The voltage comparators 100a, 100b, and 100c illustrated in FIG. 8A to FIG. 8C have a structure in which the switches S5 and S6 are removed from the voltage comparator 100 of FIG. 3 or the switch S8 is added to the voltage comparator 100 of FIG. 3. Here, because the removed or added switches S5, S6, and S8 are operated only for the reset operation, the other operations (the sampling operation, the hold operation, and the latch operation) of the voltage comparators 100a, 100b, and 100c are the same as those of the voltage comparator 100 of FIG. 3. That is, FIG. 8A to FIG. 8C illustrate the other reset methods of the voltage comparators 100a-100c.

FIG. 8A, FIG. 8B, and FIG. 8C show the constituent elements for the reset operation among the constituent elements of the voltage comparators 100a, 100b, and 100c by the dotted line.

The reset method illustrated in FIG. 8A is a most basic reset method. That is, the reset method illustrated in FIG. 8A may be applied to the reset method illustrated in FIG. 8B and the reset method illustrated in FIG. 8C. The voltage comparator 100a illustrated in FIG. 8A has the structure in which the switches S5 and S6 are removed in the voltage comparator 100 of FIG. 3. If the gates of two input transistors M1 and M2 are connected with the short connection through the turned-on switch S7, the charges existing in the gate capacitors $C_{GD}$, $C_{GS}$, and $C_{GB}$ of the input transistors M1 and M2 are removed. The structure of the voltage comparator 100a illustrated in FIG. 8A may reduce the number of switches included in the voltage comparator such that the area and the power consumption of the voltage comparator 100a may be minimized.

The voltage comparator 100b illustrated in FIG. 8B has the same structure as the voltage comparator 100a illustrated in FIG. 8A. In the reset method illustrated in FIG. 8B, the sources and the drains of the input transistors M1 and M2 are shorted through the turned-on switches S3 and S4 to be reset. In this case, the switches S3 and S4 may be turned on or off in response to the clock signal Q1 for the sampling operation or the clock signal QL for the reset operation. Accordingly, the influences that may be generated by the overlap capacitors $C_{GD}$ and $C_{GS}$ of the input transistors M1 and M2 may be removed.

The voltage comparator 100c illustrated in FIG. 8C has the structure in which the switch S8 is added to the voltage comparator 100a illustrated in FIG. 8A. The reset method illustrated in FIG. 8C respectively shorts the sources and the drains of two input transistors M1 and M2 through the turned-on switch S8 to be reset. That is, if the switch S8 is turned on, the source of the input transistor M1 and the source of the input transistor M2 are shorted and connected and the drain of the input transistor M1 and the drain of the input transistor M2 are shorted and connected. The switch S8 may be turned off or on in response to the clock signal QL for the reset operation. Accordingly, the influence of the overlap capacitors $C_{GD}$ and $C_{GS}$ of the input transistors M1 and M2 may be removed.

Figure 9:
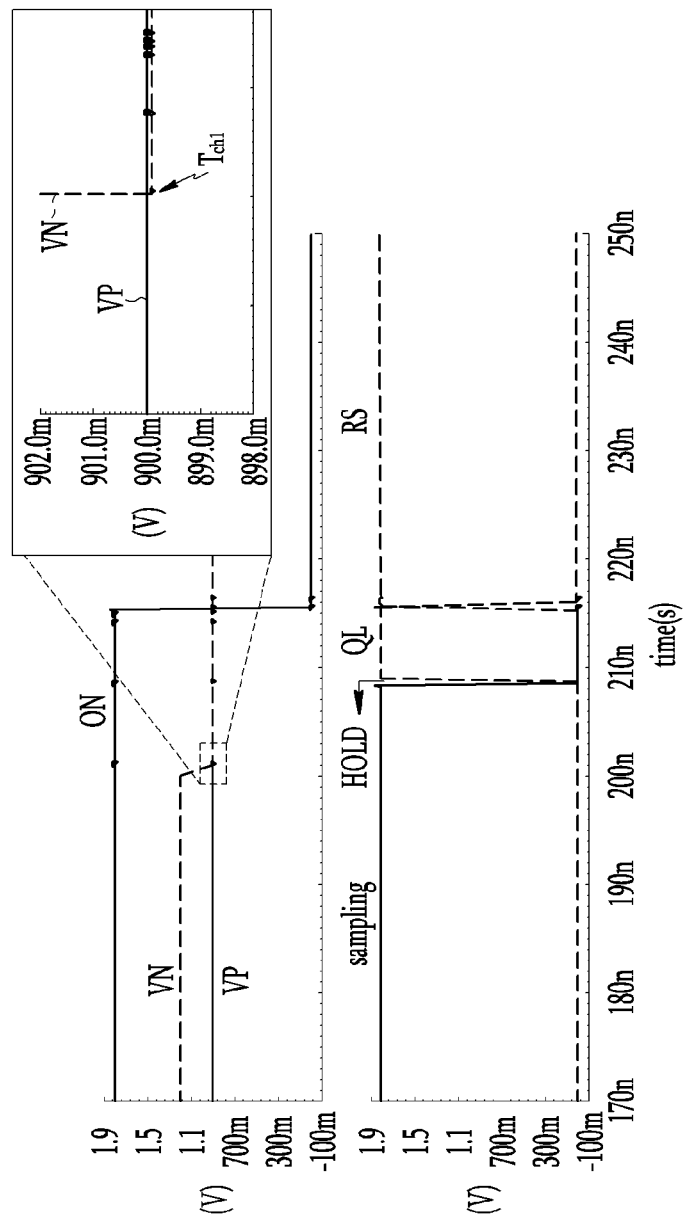
FIG. 9 is a view showing a simulation result of a voltage comparator according to an exemplary embodiment of the present invention.

FIG. 9 is a view showing a simulation result of a voltage comparator according to an exemplary embodiment of the present invention.

A simulation illustrated in FIG. 9 is performed through an overdrive recovery test mainly used for the performance test of the voltage comparators 100 and 100a to 100c.

When the magnitude difference between two input signals VN and VP is a maximum (about 300 mV), and then the magnitude of the input signal VN is reduced, the magnitude difference between the two input signals VN and VP becomes a minimum (about 100 µV) after the certain time $T_{ch1}$.

It is confirmed that the output signal ON representing the result value showing the magnitude difference between the two input signals VN and VP is appropriately changed from the high level to the low level. That is, it is confirmed that the voltage comparators 100 and 100a to 100c having the structure in which the simple switch is added to the latch circuit may perform the functions (the sampling function and the hold function) of the S/H circuit 11 of the voltage comparator 10 of FIG. 1 and the functions (the latch function and the reset function) of the latch circuit 12.

To describe the concept of the present invention, the voltage comparators 100 and 100a to 100c including the latch circuit of the predetermined structure are described until now as an example of the present invention, however this is only exemplary. The voltage comparator structure receiving the signal input through the gate of the transistor has the same components as the above-described parasitic capacitor such that the present invention may be equally and similarly applied to the voltage comparator having this structure.

The voltage comparator structure according to an exemplary embodiment of the present invention has the following characteristics. The voltage comparator according to an exemplary embodiment of the present invention has the structure in which the S/H circuit and the latch circuit are integrated into one circuit. The voltage comparator according to an exemplary embodiment of the present invention has the structure in which the switch is added to the latch circuit. The voltage comparator according to an exemplary embodiment of the present invention has the structure for sampling the voltage of the input signal through the gate capacitor. The voltage comparator according to an exemplary embodiment of the present invention has the structure for averaging the charge stored in the gate capacitor to be reset. The voltage comparator according to an exemplary embodiment of the present invention has the structure that is operated based on the single phase clock signal Q1.

The exemplary embodiment of the present invention is not implemented only by the above-explained device and/or method, but can be implemented through a program for realizing functions corresponding to the configuration of the exemplary embodiments of the present invention and a recording medium having the program recorded thereon. Such implementation can be easily made by a skilled person in the art to which the present invention pertains from the above description of the exemplary embodiment.

According to an exemplary embodiment of the present invention, by adding the switch to the latch circuit, the voltage comparator in which the S/H circuit and the latch circuit are integrated can be simply realized.

Also, according to an exemplary embodiment of the present invention, because only the MOSFET (metal-oxide-semiconductor field-effect transistor) is used without the passive element, strengths for PVT (process voltage temperature) changes can be obtained.

Further, according to an exemplary embodiment of the present invention, by adjusting a value of a gate capacitor, it is possible to control the value of the sampling capacitor.

In addition, according to an exemplary embodiment of the present invention, because a complicated clock method or clock circuit is not used, the power consumption and the area can be minimized.

Also, according to an exemplary embodiment of the present invention, because it is not necessary to use the common mode voltage, the power consumption and the area can be minimized.

Further, according to an exemplary embodiment of the present invention, because the input switch is turned off during the latch operation, a kickback phenomenon can be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A voltage comparator comparing a voltage of a first input signal and a voltage of a second input signal, comprising:
    a first switch pair transmitting, respectively, the first input signal and the second input signal to a gate of a first transistor and a gate of a second transistor in response to a clock signal;
    a second switch pair connecting a drain and a source of the first transistor and connecting a drain and a source of the second transistor in response to at least one of the clock signal and a reset signal; and
    a first reset switch connecting the gate of the first transistor and the gate of the second transistor in response to the reset signal.

2. The voltage comparator of claim 1, wherein
    when the first switch pair and the second switch pair are turned on in a first period in which the clock signal is a first level, the first input signal and the second input signal are respectively charged to a first parasitic capacitor of the first transistor and a second parasitic capacitor of the second transistor.

3. The voltage comparator of claim 2, wherein
    the first parasitic capacitor includes a first gate capacitance expressed by a sum of a capacitance due to a gate oxide of the first transistor and a capacitance due to a depletion region of the first transistor.

4. The voltage comparator of claim 2, wherein
    when the first switch pair and the second switch pair are turned off in a second period in which the clock signal is a second level, a first charge amount stored in the first parasitic capacitor and a second charge amount stored in the second parasitic capacitor are maintained.

5. The voltage comparator of claim 4, wherein
    the second period includes a first sub-period in which the first charge amount and the second charge amount are maintained and a second sub-period in which a latch signal is the first level, and
    when a third transistor is activated in the second sub-period after the first sub-period, a first signal representing a comparison result between the first charge amount and the second charge amount is output.

6. The voltage comparator of claim 5, wherein
    one terminal of the third transistor is connected to a first node, the other terminal of the third transistor is connected to a ground voltage, and
    the first node is connected to the first transistor, the second transistor, and the second switch pair.

7. The voltage comparator of claim 5, wherein
    a starting point of the second sub-period is controlled through a time delay for the clock signal, and
    an end point of the second sub-period is determined based on an asynchronous clock signal.

8. The voltage comparator of claim 5, wherein
    the second period further includes a third sub-period in which the reset signal is the first level,
    when the first reset switch is turned on in the third sub-period after the second sub-period, the charge of the first parasitic capacitor and the charge of the second parasitic capacitor are reset.

9. The voltage comparator of claim 8, wherein
    the charge of the first parasitic capacitor and the charge of the second parasitic capacitor are reset through averaging of the charge of the first parasitic capacitor and the charge of the second parasitic capacitor.

10. The voltage comparator of claim 8, wherein
    a starting point of the third sub-period is the same as the end point of the second sub-period, and
    an end point of the third sub-period is the same as an end point of the second period.

11. The voltage comparator of claim 1, further comprising:
    a second reset switch connecting the gate of the first transistor and the drain of the first transistor in response to the reset signal; and
    a third reset switch connecting the gate of the second transistor and the drain of the second transistor in response to the reset signal.

12. The voltage comparator of claim 1, further comprising a second reset switch connecting the gate of the first transistor and the drain of the second transistor and connecting the source of the first transistor and the source of the second transistor in response to the reset signal.

13. A comparison method for comparing a voltage of a first input signal and a voltage of a second input signal by a voltage comparator including a first transistor, a second transistor, and a third transistor, comprising:

respectively charging the first input signal and the second input signal to a first parasitic capacitor of the first transistor and a second parasitic capacitor of the second transistor by turning on a first switch pair and a second switch pair included in the voltage comparator in a first period in which a clock signal is a first level;

holding a first charge amount of the first parasitic capacitor and a second charge amount of the second parasitic capacitor during a first sub-period among a second period by turning off the first switch pair and the second switch pair in the second period in which the clock signal is a second level; and comparing the first charge amount and the second charge amount by activating the third transistor in a second sub-period after the first sub-period among the second period.

14. The comparison method of claim 13, further comprising resetting the first parasitic capacitor and the second parasitic capacitor by turning on a first reset switch included in the voltage comparator in a third sub-period after the second sub-period among the second period.

15. The comparison method of claim 13, wherein a starting point of the second sub-period is controlled through a time delay for the clock signal, and an end point of the second sub-period is determined through an asynchronous clock signal.

16. The comparison method of claim 14, wherein a starting point of the third sub-period is the same as an end point of the second sub-period, and an end point of the third sub-period is the same as an end point of the second period.

17. The comparison method of claim 13, wherein the charging includes:

respectively transmitting the first input signal and the second input signal to a gate of the first transistor and a gate of the second transistor through the first switch pair; and connecting a drain and a source of the first transistor and connecting a drain and a source of the second transistor through the second switch pair.

18. The comparison method of claim 14, wherein the resetting includes:

connecting a gate of the first transistor and a gate of the second transistor through the first reset switch;

connecting the gate of the first transistor and a drain of the first transistor by turning on a second reset switch included in the voltage comparator; and connecting the gate of the second transistor and a drain of the second transistor by turning on a third reset switch included in the voltage comparator.

19. A reset method of a voltage comparator including a first transistor and a second transistor, comprising:

turning on a first reset switch connecting a gate of the first transistor and a gate of the second transistor in a reset period;

turning on a second reset switch connecting the gate of the first transistor and a drain of the first transistor in the reset period; and turning on a third reset switch connecting the gate of the second transistor and a drain of the second transistor in the reset period.

20. The reset method of claim 19, wherein a first period in which a clock signal for an operation of the voltage comparator has a first level includes a sampling period in which a first input signal and a second input signal are respectively charged to a first parasitic capacitor of the first transistor and a second parasitic capacitor of the second transistor, and a second period in which the clock signal has a second level includes a latch period in which a charge amount of the first parasitic capacitor and a charge amount of the second parasitic capacitor are compared, and the reset period after the latch period.

* * * * *